United States Patent [19]

Feldmann et al.

[11] 4,395,689
[45] Jul. 26, 1983

[54] ELASTIC SURFACE WAVE RECURSIVE FILTER

[76] Inventors: Michel Feldmann, 45, rue Saint Lambert, 75015 Paris; Jeannine Henaff, 3ter, Place Marquis, 92140 Clamart, both of France

[21] Appl. No.: 263,269

[22] Filed: May 13, 1981

[30] Foreign Application Priority Data

Jun. 10, 1980 [FR] France .................... 80 12869

[51] Int. Cl.³ .................... H03H 9/64; H03H 9/25
[52] U.S. Cl. .................... 333/195; 333/166; 333/196
[58] Field of Search .................... 333/150–155, 333/193–196, 166; 331/107 A; 310/313 R, 313 A, 313 B, 313 C, 313 D; 330/5.5

[56] References Cited

U.S. PATENT DOCUMENTS 3,965,446  6/1976  Craven et al. .................... 333/195

Primary Examiner—Marvin L. Nussbaum
Attorney, Agent, or Firm—Oblon, Fisher, Spivak, McClelland & Maier

[57] ABSTRACT

An elastic surface wave recursive filter comprising: one passive resonator formed by two tuned transducers, a means for introducing an elastic surface wave into such resonator, such means being connected to an input of the filter, and a third transducer having the form of a transversal filter, the transducer being coupled to the resonator and connected to an output of the filter.

The transfer function of the filter is of the form $P(z)/Q(z)$, the numerator and the denominator being independant.

2 Claims, 5 Drawing Figures

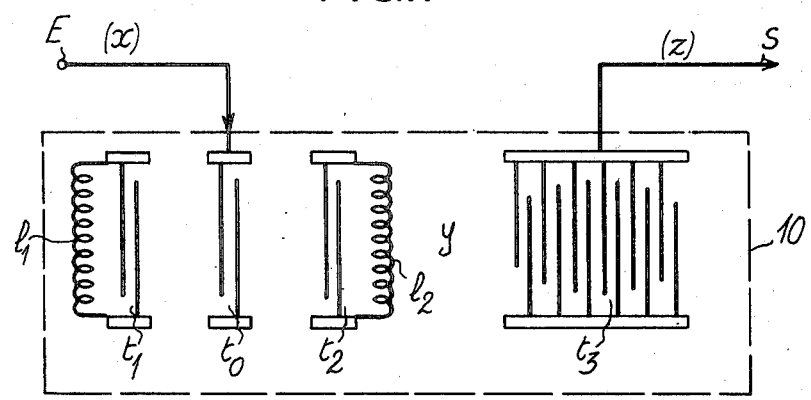
FIG.1
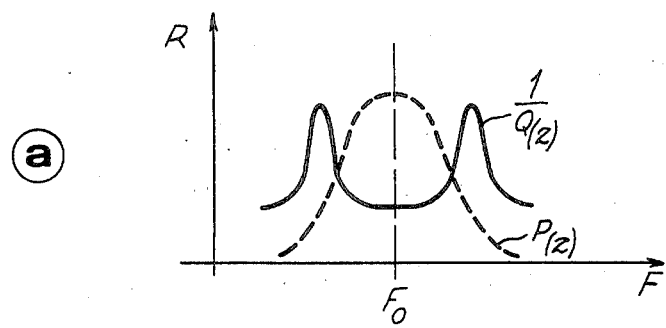
FIG.2
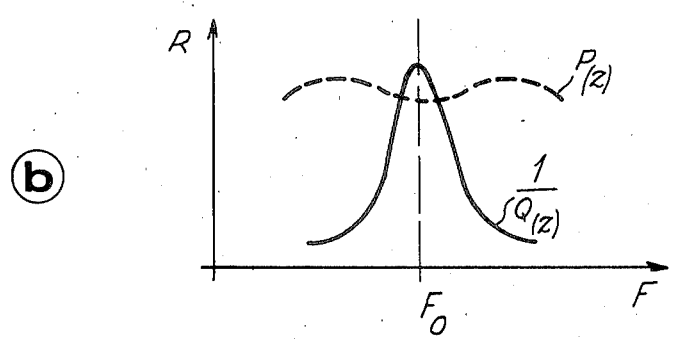

ELASTIC SURFACE WAVE RECURSIVE FILTER

The invention relates to an elastic surface wave recursive filter, for use in electronics and more particularly in the making of telecommunication equipment.

Elastic surface wave filters can be divided into two categories:

transversal filters, which are formed by a given impulse response transducer followed by a reading transducer, resonator filters, which are formed by elastic surface wave resonators coupled to one another, the resonators being obtained, for example, by means of engraved grooves.

Such devices are disclosed inter alia in the work of H. MATTHEWS (Editor) entitled "Surface Wave Filters", John Wiley (1977) and in the work of A. A. Oliner (Editor) entitled "Acoustic Surface Waves", included in the Collection "Topics in Applied Physics", vol. 24, Springer Verlag (1978).

The filters of the first category have a transfer function of the form $P(z)$ where z is a complex variable equal to jwt, w being a pulsation and t being time. This function has no poles, and the associated filters are non-recursive. The filters of the second category have a transfer function of the form $P(z)/Q(z)$, the presence of the denominator $Q(z)$ involving the existence of poles. These filters are recursive.

The invention relates to recursive filters—i.e., filters whose transfer function is of the form $P(z)/Q(z)$. The prior art recursive filters have the disadvantage that the numerator and the denominator of their transfer function are tied, resulting in difficulties when a particular response must be synthesized.

The invention, which aims at obviating this disadvantage, proposes a filter which leads to the independence of the numerator and denominator of the corresponding transfer function, thus leaving a greater latitude in the selection of the components of the filter.

To this end the filter according to the invention is characterized in that it comprises: at least one passive resonator formed by two tuned transducers $t_1$, $t_2$, a means for introducing an elastic surface wave into such resonator, such means being connected to an input of the filter, and a third transducer $t_3$ having the form of a transversal filter, the transducer being coupled to the resonator and connected to an output of the filter.

In any case, the features and advantages of the invention will be gathered more clearly from the following description of non-limitative exemplary embodiments with reference to drawings wherein:

FIG. 1 shows a first embodiment of a filter according to the invention,

FIG. 2 shows two examples of frequency response of the elements making up the filter according to the invention.

Figure 3:
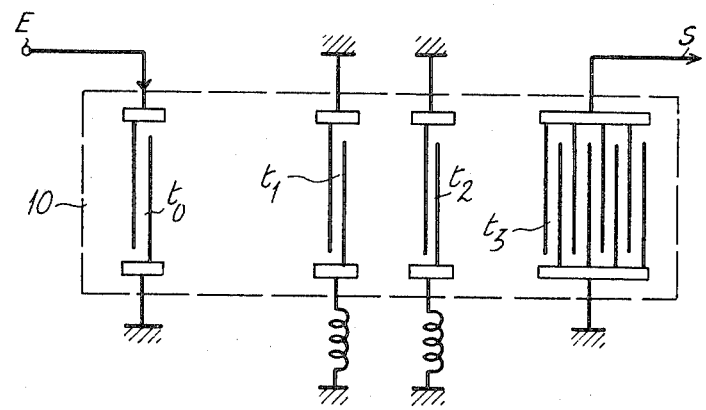
FIG. 3 shows a second embodiment of a filter according to the invention.

Referring to FIG. 1, a filter comprises, on a substrate 10 adapted to propagate elastic surface waves (for example, lithium niobate), a first transducer $t_1$ tuned by an inductance $l_1$, and a second transducer $t_2$ tuned by an inductance $l_2$, the two transducers defining an elastic wave resonator. The elastic waves are introduced into the resonator by an extra transducer $t_0$ which is connected to an input E. The filter illustrated also comprises a third transducer $t_3$ in the form of a transversal filter. It has a transfer function $P(z)$. The latter transducer is connected to an output S.

The device operates as follows. If x is the input signal applied to the transducer $t_0$, y the signal transmitted by $t_2$ in the direction of $t_3$, R the coefficient of reflexion of each of the tuned transducers $t_1$ and $t_2$, K the coefficient of transmission of $t_2$, and T the delay of the wave when it crosses the interval lying between $t_1$ and $t_2$, we have:

$$y = KT^{\frac{1}{2}}(x + TR^2x + T^2R^4x^2 + \ldots),$$

that is:

$$y = \frac{KT^{\frac{1}{2}}}{1 - R^2T} x$$

and also:

$$y = \frac{1}{Q(z)} x$$

with $Q(z)=1-R^2T(z)$, or else $Q(z)=1-GT(z)$, taking $R^2=G$.

The similar behaviour will be observed between the elastic surface wave resonator formed by the transducers $t_1$ and $t_2$ and the Perot-Fabry type optical resonators formed by two plane mirrors.

The output signal s appearing after the transducer $t_3$ is therefore of the form:

$$s = \frac{P(z)}{Q(z)} x$$

The global transfer function of the filter between the input E and the output S is therefore of the form $N(z)/D(z)$, where the denominator is defined exclusively by the input resonator $t_1t_2$.

The function $1/Q(z)$ is not in fact just any function, since the device which determines the function is a resonator introducing a delay of n basic periods. We therefore have:

$$T(z)=z^{-n}$$

or else, taking $G=r^n$:

$$GT(z)=(r/z)^n$$

and obviously:

$$1-GT=z^{-n}(z^n-r^n)$$

The global transfer function of the filter is therefore finally of the form:

$$\frac{z^n P(z)}{z^n - r^n}$$

in which the denominator is imposed.

The synthesis of the filter therefore amounts to the calculation of a suitable numerator or else the synthesis of the transversal filter $t_3$. Methods for doing this are known. For example, reference can be made to the articles by:

M. Feldmann and J. Henaff, entitled "Design of Saw Filter with minimum Phase Response", published in IEEE Ultrasonics Symposium, Sept. 25-27, 1978, Cherry Hill (N.J.) U.S.A., J. Henaff and M. Feldmann, entitled "Design and Capabilities of Saw Filters: Synthesis and Technologies", published in the 1979 Papers of the IEEE International Symposium on Circuits and Systems, ISCAS 79, Tokyo, Japan, 17-19 July 1979.

M. Feldmann, entitled "Direct Synthesis of Minimum Phase Transversal Filters" published in the same Papers of the IEEE International.

FIG. 2 shows two examples of frequency (F) response (R) which can be used for forming a filter according to the invention. The function $1/Q(z)$ is shown by a solid line, the function $P(z)$ being shown by a chain line. In FIG. (a) the function $1/Q(z)$ has two "bosses", having only one boss in FIG. (b).

By way of example, a simple example can be given of determining a filter according to the invention. Let us suppose we have to make a recursive filter defined by the function:

$$\frac{P(z)}{Q(z)} = \frac{z^2 - 2z\cos\theta + 1}{z^2 + rz + r^2} \text{ (where } r < 1\text{)}$$

This function corresponds to an elliptical filter of the second order.
The transfer function corresponding to a delay of duration $\sigma = 2/w_0$, where $w_0$ is the central frequency of the system is also denoted by $z^{-1}$.

Then a line is formed with a delay of $3\sigma$, whose transfer function is:

$$T(z) = z^{-3}$$

we have:

$$GT = r^3 z^{-3}$$

and:

$$1 - GT = z^{-3}(z^3 - r^3) = z^{-3}(z-r)(z^2 + rz + r^2)$$

It is then enough to take $P(z)$ proportional to:

$$z^{-3}(z-r)(z^2 - 2z\cos\theta + 1),$$

i.e.:

$$P(z) = 1 - z^{-1}(r + 2\cos\theta) + z^{-2}(1 + 2r\cos\theta) - rz.$$

The transducer $t_3$ therefore permits as coefficient:

1, $(r+2\cos\theta)$, $(1+2\cos\theta)$, $r$.

Of course, the embodiment illustrated in FIG. 1 is given merely by way of explanation, and other modes might be imagined which come within the scope of the invention. Some of them are illustrated in FIGS. 3-6.

The filter illustrated in FIG. 3 is distinguished from the one illustrated in FIG. 1 by the fact that the extra transducer $t_0$ which receives the signal to be filtered is disposed outside the resonator formed by $t_1$ and $t_2$.

Figure 4:
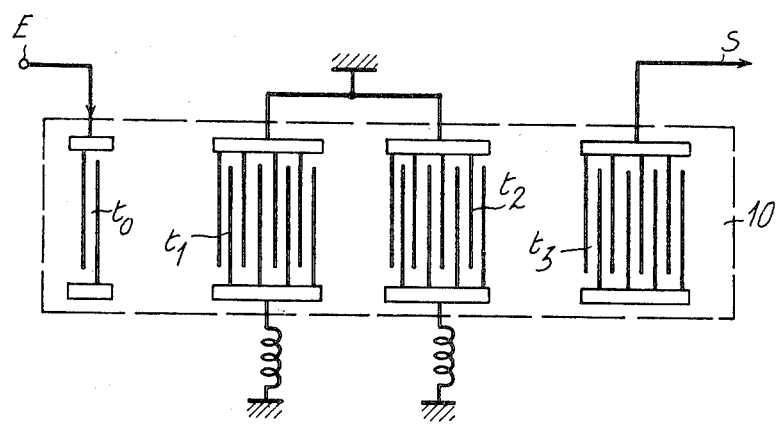
FIG. 4 shows a third embodiment of a filter according to the invention.

The filter illustrated in FIG. 4 is similar to that illustrated in FIG. 3, but the trandsducers of the resonator are of the interdigited comb type.

Figure 5:
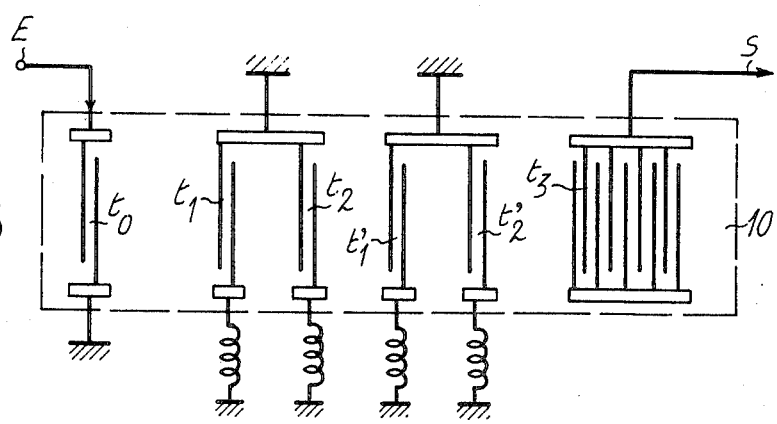
FIG. 5 shows a fourth embodiment of a filter according to the invention.

Finally, the filter illustrated in FIG. 5 comprises a plurality of resonators formed by transducers ($t_1$, $t_2$), ($t_1'$, $t_2'$), etc. . . . , an input transducer $t_0$ and an output transducer $t_3$.

Other variants might also be imagined on the basis of these Examples.

We claim:

1. An elastic surface wave filter, comprising:
a substrate adapted to propagate elastic surface waves;
a first tuned transducer;
a second tuned transducer having a coefficient of transmission;
said first and second transducers disposed on said substrate to form a passive resonator for said elastic surface waves;
an extra transducer, disposed on said substrate between said first and second transducers and connected to an input of the filter, forming a means for introducing an elastic surface wave into said resonator whereby a resonant elastic surface wave is obtained in said resonator, partly transmitted through said second transducer, and a transmitted elastic surface wave propagates on the output side of said second transducer;
a transversal filter having a predetermined transfer function without poles, said transversal filter disposed on said substrate on the output side of said second transducer for receiving said transmitted elastic surface wave, said transversal filter connected to an output of the filter.

2. An elastic surface wave filter, comprising:
a substrate adapted to propagate elastic surface waves;
a first tuned transducer havig a coefficient of transmission;
a second tuned transducer having a coefficient of transmission;
said first and second transducers disposed on said substrate to form a passive resonator for said elastic surface waves;
an extra transducer, disposed on said substrate on the input side of said first transducer and connected to an input of the filter, forming a means for introducing an elastic surface wave through said first transducer into said resonator whereby a resonant elastic surface wave is obtained in said resonator, partly transmitted through said second transducer and a transmitted elastic surface propagates on the output side of said second transducer;
a transversal filter having a predetermined transfer function without poles, said transversal filter disposed on said substrate on the output side of said second transducer for receiving said transmitted elastic surface wave, said transversal filter connected to an output of the filter.

* * * * *